(12) United States Patent
Hönigschmid et al.

(10) Patent No.: US 6,538,913 B2
(45) Date of Patent: Mar. 25, 2003

(54) METHOD FOR OPERATING A FERROELECTRIC MEMORY CONFIGURATION AND A FERROELECTRIC MEMORY CONFIGURATION

(75) Inventors: Heinz Hönigschmid, East Fishkill, NY (US); Thomas Röhr, Yokohama (JP)

(73) Assignee: Infineon Technologies AG, Munich (DE)

( * ) Notice: Subject to any disclaimer, the term of this patent is extended or adjusted under 35 U.S.C. 154(b) by 136 days.

(21) Appl. No.: 09/826,232

(22) Filed: Apr. 4, 2001

(65) Prior Publication Data

US 2001/0036099 A1 Nov. 1, 2001

(30) Foreign Application Priority Data

Apr. 4, 2000 (DE) .......................................... 100 16 726

(51) Int. Cl.$^7$ ............................................... G11C 11/22
(52) U.S. Cl. .................. 365/145; 365/203; 365/189.01
(58) Field of Search ................................ 365/145, 203, 365/189.01, 149, 104, 65

(56) References Cited

U.S. PATENT DOCUMENTS

| | | |
|---|---|---|
| 5,121,353 A | 6/1992 | Natori |
| 5,959,878 A | 9/1999 | Kamp ........................ 365/117 |
| 6,002,608 A * | 12/1999 | Tanabe ....................... 365/154 |

FOREIGN PATENT DOCUMENTS

| | | |
|---|---|---|
| DE | 197 24 449 A1 | 12/1997 |
| DE | 198 32 994 A1 | 1/2000 |
| DE | 198 32 991 A1 | 2/2000 |

* cited by examiner

Primary Examiner—David Nelms
Assistant Examiner—David Lam
(74) Attorney, Agent, or Firm—Herbert L. Lerner; Laurence A. Greenberg; Werner H. Stemer

(57) ABSTRACT

The invention relates to a method for operating a ferroelectric memory configuration in the $V_{DD}/2$ mode. The memory configuration has a large number of memory cells which each have at least one selection transistor, one storage capacitor with an upper and a lower electrode and one short-circuiting transistor whose source-drain junction is connected in parallel with the storage capacitor. After a read or write procedure in which the memory cells are driven via respectively associated word lines and via respectively associated bit lines which are precharged in a precharge phase, the short-circuiting transistor is driven during a standby phase and in the process short-circuits the electrodes in the storage capacitor. The method is characterized in that the time of the standby phase coincides with the time of the precharge phase and, in the process, the bit lines are at a different potential with respect to that of the two electrodes of the storage capacitor.

7 Claims, 2 Drawing Sheets

PRIOR ART

METHOD FOR OPERATING A FERROELECTRIC MEMORY CONFIGURATION AND A FERROELECTRIC MEMORY CONFIGURATION

BACKGROUND OF THE INVENTION

1. Field of the Invention

The invention relates to a method for operating a ferroelectric memory configuration in the $V_{DD}/2$ mode. The memory configuration has a large number of memory cells which each have at least one selection transistor, one storage capacitor with an upper and a lower electrode and one short-circuiting transistor whose source-drain junction is connected in parallel with the storage capacitor. After a read or write procedure in which the memory cells are driven via respectively associated word lines and via respectively associated bit lines, which are precharged in a precharge phase, the short-circuiting transistor is driven during a standby phase and in the process short-circuits the electrodes in the storage capacitor. The invention also relates to a ferroelectric memory configuration operated using this method.

A ferroelectric memory configuration which is operated using such a method is known from German Patent Document DE 19 832 994 (Siemens AG). The known method allows a ferroelectric memory which has a large number of memory cells to be operated in the $V_{DD}/2$ mode without any refresh cycles.

In general, there is a risk with nonvolatile memories such as these, which are in the form of integrated circuits, that parasitic components will cause voltage differences at the electrodes of ferroelectric storage capacitors. Depending on the polarization of the dielectric of the storage capacitor and the polarity of the voltage differences, these voltage differences increase or decrease the polarization of the dielectric.

Thus, in the worst case, incorrect assessment of information when reading from the memory configuration can occur, and this corresponds to loss of data.

In the memory configuration described in the abovementioned document, the short-circuiting transistor, which is provided in parallel with the storage capacitor in each memory cell, is used to connect the memory nodes to the upper or top electrode plate of the storage capacitor, thus compensating for the junction leakage current of the memory node.

FIG. 1 is a schematic illustration showing a section through a known memory cell of a ferroelectric memory configuration that is equipped with such a short-circuiting transistor. It can clearly be seen, in this example of a memory cell, that the storage capacitor C is located under the bit line BL. The storage capacitor C has an upper plate or top electrode TE and a lower plate or bottom electrode BE. A ferroelectric dielectric D, for example composed of PZT (lead zirconium titanate), is located between the upper plate TE and the lower plate BE of the storage capacitor C. A number of $n^+$-conductive zones are diffused in a semiconductor body which is, for example, a p-substrate. Word lines WL0, WL1, WL2, WL3, etc, which run at right angles to the plane of the paper in the section illustrated in FIG. 1, are located above the substrate and between the $n^+$-conductive zones. The $n^+$-conductive zones between adjacent word lines, for example, between WL0 and WL1; WL2 and WL3 shown in FIG. 1, form common nodes CN.

A short-circuiting transistor SH which, for example, is a field-effect transistor of the depletion type, is located under the word line WL2 between the memory node SN, which is connected to the lower capacitor electrode BE, and the adjacent $n^+$-region, which is connected to the upper capacitor electrode BE. When an appropriate drive signal is present, the short-circuiting transistor SH connects the upper capacitor electrode TE to the lower capacitor electrode BE, that is to say it short-circuits the two electrodes. Considered over the entire memory configuration, a short-circuit between all of the storage capacitors C can compensate for the entire junction leakage current $I_{jct}$.

FIG. 2 uses a signal/time diagram to show the method proposed in the above document for $V_{DD}/2$ operation of the ferroelectric memory configuration with compensation for the junction leakage current $I_{jct}$ of each memory node SN.

When the memory configuration is switched on, all of the word lines WL are at zero volts. In an initial phase STB, an electrode which is common to all of the storage capacitors C and that can be connected or is connected to TE of the capacitor C is raised to the voltage $V_{DD}/2$, for example to 0.9 volts. Since the threshold voltage of the short-circuiting transistors SH is now chosen to be correspondingly strongly negative, these short-circuiting transistors SH still conduct even when the electrode which is common to all of the storage capacitors C has been charged to $V_{DD}/2$. Thus, during the initial phase STB, both electrodes of all of the ferroelectric storage capacitors C are short-circuited. In consequence, the compensation for the junction leakage currents $I_{jct}$ takes place. In this case, in a conventional 4-memory configuration, a standby current flows, defined by:

$$I_{stb1} = 2^{22} \cdot I_{jct} + 2^{21} \cdot I_{jct} \qquad (1)$$

In equation (1), the first term is governed by the memory nodes SN, and the second term by the common nodes CN.

Assuming typical values for 256-MDRAM technology ($I_{jct}=20$ fA), then the standby current is:

$$I_{stb1} = 125 \; nA.$$

This phase STB, in which the storage capacitor C is short-circuited, is followed by a precharge step PRE in that, first, all of the bit lines BL to be addressed are set to zero volts and the selection transistors are switched off. The precharge step PRE is followed by access to selected memory cells, for example to the memory node SN illustrated in FIG. 1. Since the corresponding word line WL, that is to say the word line WL1 in the example in FIG. 1, is charged from zero volts to the full supply voltage $V_{DD}$ or more, the desired ferroelectric storage capacitors C are connected to the corresponding bit lines. Since the addressed bit lines BL are precharged to 0 V by the precharge step PRE, a displacement current can flow through the ferroelectric capacitor C, with charge equalization taking place between the selected ferroelectric storage capacitors and the associated bit lines. This step is symbolized in FIG. 2 by the step READ. However, before this takes place, the gates of the short-circuiting transistors which short-circuit the selected ferroelectric storage capacitors C must be switched off. This is done by applying a negative potential to the word line corresponding to the short-circuiting transistor SH, that is to say, in the example in FIG. 1, to the word line WL2. This negative potential switches off only the desired field-effect transistors of the depletion type. Field-effect transistors of the enhancement type, which are likewise connected to the word line WL2, have already been switched off by the standby potential in the precharge step, and the negative potential only increases the high impedance further.

After assessment of the read signal READ and its amplification in the SENSE step, the selected word line, that is to say, for example, WL1, is discharged to zero volts once again, thus disconnecting the selected memory cells from the bit lines BL once again. In order to reproduce the short-circuit of the electrodes of the ferroelectric storage capacitor C, the short-circuiting transistor SH is switched on by discharging the word line WL2 corresponding to the short-circuiting transistor SH to zero volts. Finally, the word line WL1 is then discharged to zero volts in order to disconnect the selected memory cells from the bit lines BL once again. FIG. 1 shows that, apart from the leakage current $I_{jct}$, a subthreshold leakage current $I_{sth}$ also flows in the precharge phase PRE, but this is less than the junction leakage current $I_{jct}$.

SUMMARY OF THE INVENTION

It is accordingly an object of the invention to provide a method for operating a ferroelectric memory configuration and a ferroelectric memory configuration which overcomes the above-mentioned disadvantageous of the prior art apparatus and methods of this general type. In particular, it is an object of the invention to provide a method which allows the total standby current flowing to be reduced when a ferroelectric memory configuration is in the standby mode.

With the foregoing and other objects in view there is provided, in accordance with the invention, a method for operating a ferroelectric memory configuration in the $V_{DD}/2$ mode that includes providing a ferroelectric memory configuration having a plurality of memory cells which each have at least one selection transistor, one ferroelectric storage capacitor with an upper and a lower electrode, and one short-circuiting transistor having a source-drain junction connected in parallel with the storage capacitor. In a precharge phase, bit lines are precharged. A read procedure or a write procedure is performed, in which at least some of the plurality of the memory cells are driven via respectively associated word lines and via respectively associated ones of the bit lines that have been precharged in the precharge phase. In a standby phase, the storage capacitor of at least one of the plurality of the memory cells is driven to short-circuit the upper electrode and the lower electrode of the storage capacitor of the one of the plurality of the memory cells. The standby phase is performed coincident in time with the precharge phase such that the bit line associated with the one of the plurality of the memory cells is at a different potential than that of the upper electrode and the lower electrode of the storage capacitor of the one of the plurality of the memory cells.

Thus, the inventive method for operating a ferroelectric memory which is operated in the $V_{DD}/2$ mode and which already has leakage current compensation using the described short-circuiting transistor consists of using the short-circuiting transistor to compensate for the subthreshold leakage current $I^{sth}$ as well.

Since this avoids the STB phase, which is normally used for compensation, in the time sequence, it not only permits the total standby current to be reduced (by 30% in the case of a 4-memory configuration), but also allows the speed of operation of the memory configuration to be increased.

The inventive method can also be used in the same sense for other types of memories which have a hysteresis characteristic.

In accordance with an added mode of the invention, after selecting the one of the plurality of the memory cells, an actuation phase of a corresponding short-circuiting transistor of the selected one of the plurality of the memory cells is ended by applying a negative potential to a word line associated with the short-circuiting transistor.

In accordance with an additional mode of the invention, in order to short-circuit the upper electrode and the lower electrode of the storage capacitor of the one of the plurality of the memory cells, the word line which is connected to a corresponding short-circuiting transistor is discharged to zero volts once again.

In accordance with another mode of the invention, the upper electrode of all of the storage capacitors is connected to a common electrode line.

In accordance with a further mode of the invention, the upper electrode of all of the storage capacitors is configured such that each upper electrode can be connected to a common electrode line.

In accordance with a further added mode of the invention, a common electrode is provided, and the short-circuiting transistors of each one of the plurality of the memory cells are provided with a source and a drain that can be connected to the common electrode.

With the foregoing and other objects in view there is provided, in accordance with the invention, a ferroelectric memory configuration having a hysteresis characteristic, that includes: a plurality of memory cells which each have at least one selection transistor, one ferroelectric storage capacitor with an upper and a lower electrode, and one short-circuiting transistor having a source-drain junction connected in parallel with the storage capacitor. Word lines and bit lines associated with respective ones of the plurality of the memory cells are provided. The plurality of the memory cells are configured for precharging the bit lines in a precharge phase. The plurality of the memory cells are configured for performing a procedure selected from the group consisting of a read procedure and a write procedure, in which at least some of the plurality of the memory cells are driven via respectively associated ones of the word lines and via respectively associated ones of the bit lines that have been precharged in the precharge phase. The plurality of the memory cells are configured for, in a standby phase, driving the storage capacitor of at least one of the plurality of the memory cells to short-circuit the upper electrode and the lower electrode of the storage capacitor of the one of the plurality of the memory cells. The plurality of the memory cells are also configured for performing the standby phase coincident in time with the precharge phase such that the bit line that is associated with the one of the plurality of the memory cells is at a different potential than that of the upper electrode and the lower electrode of the storage capacitor of the one of the plurality of the memory cells.

Other features which are considered as characteristic for the invention are set forth in the appended claims.

Although the invention is illustrated and described herein as embodied in a method for operating a ferroelectric memory configuration, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
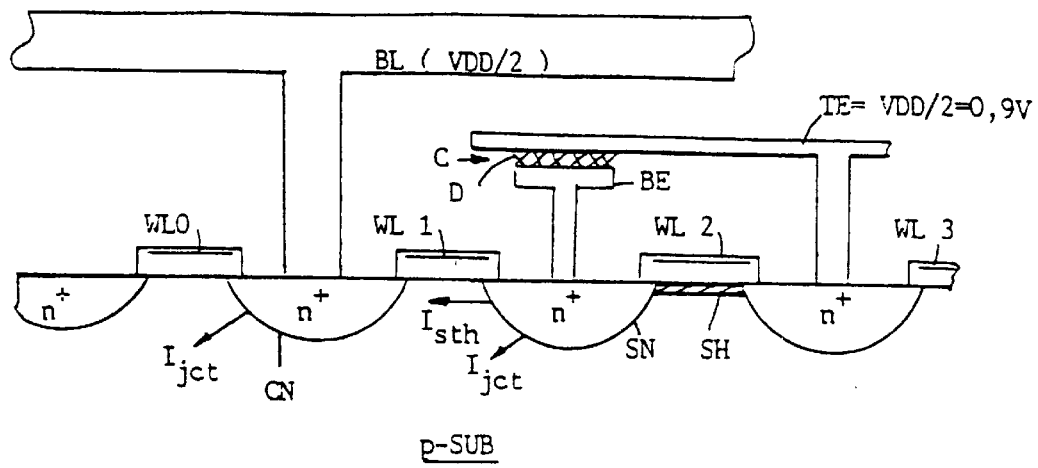
FIG. 1 is a schematic illustration showing a section taken through a memory cell of a ferroelectric memory configuration.
Figure 2:
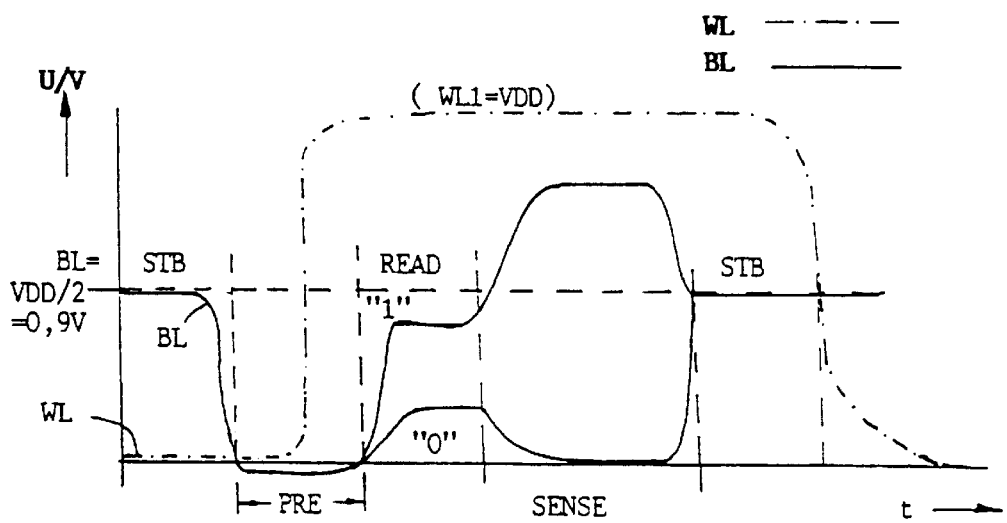
FIG. 2 shows a signal/time diagram used to illustrate a prior art method for operating a ferroelectric memory configuration.
Figure 3:
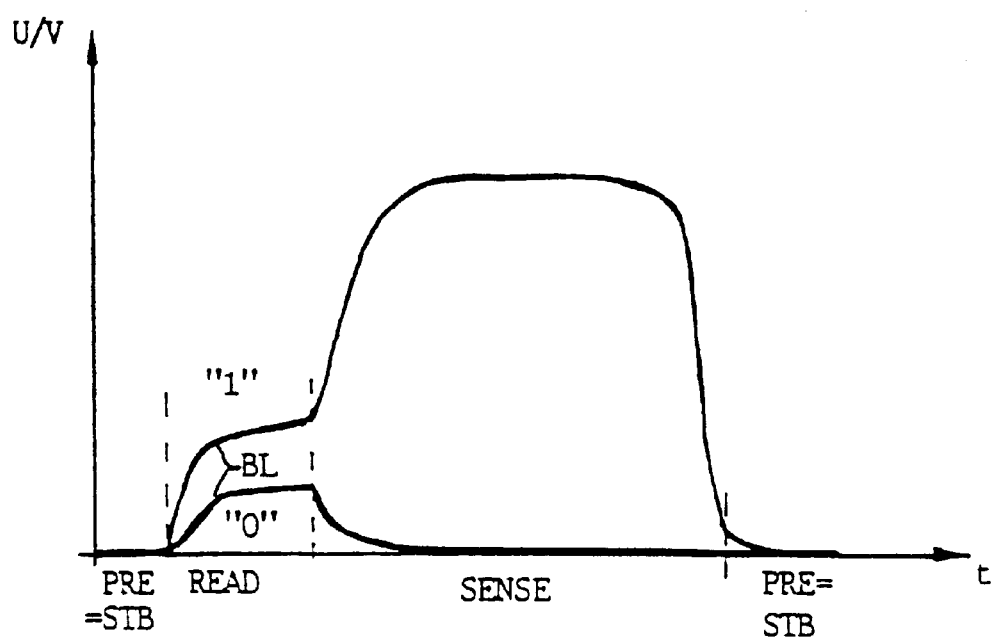
FIG. 3 shows a signal/time diagram used to illustrate the inventive method for operating a ferroelectric memory configuration.

Referring now to the figures of the drawing in detail and first, particularly, to FIG. 3 thereof, there is shown a signal/time diagram that will be used to illustrate the timing according to the present method. According to FIG. 3, the step STB in which the ferroelectric storage capacitors are short-circuited by the short-circuiting transistors coincides in time with the precharge step PRE, with the bit lines BL in this case being at a different potential to that of the upper and lower electrodes TE and BE of the storage capacitor C. This avoids the separate standby step STB. The further time sequences during a drive cycle for a memory cell may be identical to those in the prior art, which have been explained above with reference to FIGS. 1 and 2.

It should be mentioned that the structure of the memory array of a ferroelectric memory configuration in which the method according to the invention can be carried out may be the same as that disclosed in the initially mentioned document, and that all that is needed to carry out the timing according to the invention is adaptation of a control interface.

During the STB step which coincides in time with the precharge step, a subthreshold current $I_{sth}$ flows through each switched-off selection or array transistor, but the total standby current is nevertheless reduced, since $I_{sth}$ is much less than $I_{jct}$; 30% less in the assumed example of a 4-memory configuration.

As shown in FIG. 2, the access time is reduced by the time duration of the STB phase. The equation (2) below indicates the total standby current which the inventive method makes possible:

$$I_{stb2} = 2^{22} \cdot I_{jct} + 2^{22} \cdot I_{sth} \qquad (2)$$

If typical values for 256-MDRAM technology are assumed here, then the total standby current is given by:

$$I_{stb2} = 85 \ nA.$$

We claim:

1. A method for operating a ferroelectric memory configuration in the $V_{DD}/2$ mode, which comprises:
   providing a ferroelectric memory configuration having a plurality of memory cells which each have at least one selection transistor, one ferroelectric storage capacitor with an upper and a lower electrode, and one short-circuiting transistor having a source-drain junction connected in parallel with the storage capacitor;
   in a precharge phase, precharging bit lines;
   performing a procedure selected from the group consisting of a read procedure and a write procedure, in which at least some of the plurality of the memory cells are driven via respectively associated word lines and via respectively associated ones of the bit lines that have been precharged in the precharge phase;
   in a standby phase, driving the storage capacitor of at least one of the plurality of the memory cells to short-circuit the upper electrode and the lower electrode of the storage capacitor of the one of the plurality of the memory cells;
   performing the standby phase coincident in time with the precharge phase such that the bit line associated with the one of the plurality of the memory cells is at a different potential than that of the upper electrode and the lower electrode of the storage capacitor of the one of the plurality of the memory cells.

2. The method according to claim 1, which comprises: after selecting the one of the plurality of the memory cells, ending an actuation phase of a corresponding short-circuiting transistor of the selected one of the plurality of the memory cells by applying a negative potential to a word line associated with the short-circuiting transistor.

3. The method according to claim 1, which comprises: in order to short-circuit the upper electrode and the lower electrode of the storage capacitor of the one of the plurality of the memory cells, discharging the word line which is connected to a corresponding short-circuiting transistor to zero volts once again.

4. The method according to claim 1, which comprises: connecting the upper electrode of all of the storage capacitors to a common electrode line.

5. The method according to claim 1, which comprises: configuring the upper electrode of all of the storage capacitors such that each upper electrode can be connected to a common electrode line.

6. The method according to claim 1, which comprises:
   providing a common electrode; and
   providing the short-circuiting transistors of each one of the plurality of the memory cells with a source and a drain that can be connected to the common electrode.

7. A ferroelectric memory configuration having a hysteresis characteristic, comprising:
   a plurality of memory cells which each have at least one selection transistor, one ferroelectric storage capacitor with an upper and a lower electrode, and one short-circuiting transistor having a source-drain junction connected in parallel with the storage capacitor; and
   word lines and bit lines associated with respective ones of said plurality of said memory cells;
   said plurality of said memory cells configured for precharging said bit lines in a precharge phase;
   said plurality of said memory cells configured for performing a procedure selected from the group consisting of a read procedure and a write procedure, in which at least some of said plurality of said memory cells are driven via respectively associated ones of said word lines and via respectively associated ones of said bit lines that have been precharged in the precharge phase;
   said plurality of said memory cells configured for, in a standby phase, driving said storage capacitor of at least one of said plurality of said memory cells to short-circuit said upper electrode and said lower electrode of said storage capacitor of said one of said plurality of said memory cells;
   said plurality of said memory cells configured for performing the standby phase coincident in time with the precharge phase such that one of said bit lines that is associated with said one of said plurality of said memory cells is at a different potential than that of said upper electrode and said lower electrode of said storage capacitor of said one of said plurality of said memory cells.

* * * * *